(12) United States Patent
Cheng et al.

(10) Patent No.: US 6,813,165 B2
(45) Date of Patent: Nov. 2, 2004

(54) BOARD-LOCKING FASTENER FOR FASTENING A MOTHERBOARD ON A HOUSING OF A COMPUTER

(75) Inventors: Kuang-Jui Cheng, Taipei Hsien (TW); Ching-Wen Wang, Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 0 days.

(21) Appl. No.: 10/679,331

(22) Filed: Oct. 7, 2003

(65) Prior Publication Data

US 2004/0095733 A1 May 20, 2004

(30) Foreign Application Priority Data

Nov. 18, 2002 (TW) ...................................... 91218507 U

(51) Int. Cl.[7] .............................. H05K 7/12; H05K 7/14
(52) U.S. Cl. ...................... 361/801; 361/759; 361/740; 361/747; 361/732; 361/726
(58) Field of Search .............................. 361/726, 732, 361/740, 747, 752, 759, 796, 801; 174/50, 50.52, 52.1; 312/222; 211/41.17

(56) References Cited

U.S. PATENT DOCUMENTS

| | | | | |
|---|---|---|---|---|
| 5,661,640 A | * | 8/1997 | Mills et al. ................. | 361/801 |
| 5,691,504 A | * | 11/1997 | Sands et al. ............... | 174/35 R |
| 5,796,593 A | * | 8/1998 | Mills et al. ................. | 361/801 |
| 5,940,038 A | * | 8/1999 | Brown ........................ | 343/702 |
| 5,973,926 A | * | 10/1999 | Sacherman et al. ......... | 361/759 |
| 5,999,416 A | * | 12/1999 | McAnally et al. .......... | 361/816 |
| 6,114,626 A | * | 9/2000 | Barnes et al. ............... | 174/52.1 |
| 6,424,540 B1 | * | 7/2002 | Chen et al. .................. | 361/759 |

* cited by examiner

Primary Examiner—Tulsidas Patel
Assistant Examiner—Dameon E. Levi
(74) Attorney, Agent, or Firm—Nixon & Vanderhye P.C.

(57) ABSTRACT

A set of fasteners is adapted to fasten a motherboard on a computer housing. The motherboard has a first side, a second side, and a fastener slot that extends through the first and second sides. Each of the fasteners includes a positioning member and a spring arm. The positioning member permits movement of the motherboard from an unlocking position, where a periphery of the fastener slot is disengaged from the positioning member, and a locking position, where the periphery of the fastener slot is engaged within a groove in the positioning member. The spring arm is connected to the positioning member so as to be adapted to abut against the motherboard to urge the motherboard to engage the positioning member when the motherboard is at the locking position.

20 Claims, 8 Drawing Sheets

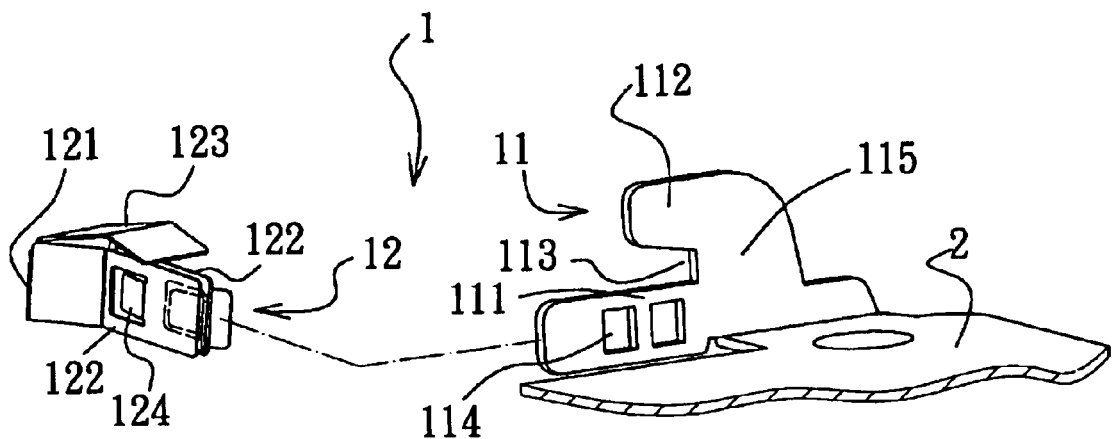
F I G. 2
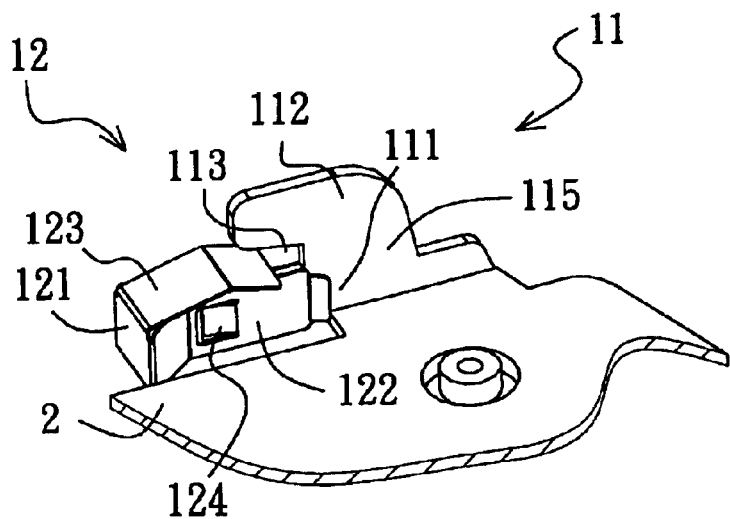
F I G. 3

BOARD-LOCKING FASTENER FOR FASTENING A MOTHERBOARD ON A HOUSING OF A COMPUTER

CROSS-REFERENCE TO RELATED APPLICATION

This application claims priority of Taiwanese application no. 091218507, filed on Nov. 18, 2002.

BACKGROUND OF THE INVENTION

1. Field of the Invention

The invention relates to a board-locking fastener, more particularly to a board-locking fastener for fastening a motherboard on a housing of a computer.

2. Description of the Related Art

A conventional motherboard is fastened to a computer housing using screws. The screws are inserted through fastener holes in the motherboard, which are aligned with corresponding screw holes in the computer housing. The screws are then tightened using a screwdriver to secure the motherboard to the computer housing. Because, the screws are removable, the motherboard can be removed upon removal of the screws.

There are certain drawbacks associated with the use of screws to fasten the motherboard to the computer housing. One drawback is that it requires a significant amount of time to insert the screws individually through the fastener holes in the motherboard and then tighten each of the screws into the screw holes in the computer housing. It is also time-consuming to remove the screws in order to permit removal of the motherboard from the computer housing for repair or maintenance.

SUMMARY OF THE INVENTION

Therefore, the main object of the present invention is to provide aboard-locking fastener that facilitates assembly and removal of a motherboard with respect to a computer housing so as to overcome the aforesaid drawbacks of the prior art.

Another object of the invention is to provide a computer with a motherboard that can be easily assembled on and removed from a computer housing through the use of board-locking fasteners.

According to one aspect of the present invention, a board-locking fastener is adapted to fasten a motherboard on a support. The motherboard has a first side, a second side opposite to the first side in a first direction, and a fastener slot that extends through the first and second sides of the motherboard. The board-locking fastener comprises a positioning member and a spring arm.

The positioning member has a base portion that is adapted to be fixed to the support, a restricting portion that is spaced apart from the base portion in the first direction, and a connecting portion that extends in the first direction, that interconnects the base portion and the restricting portion, and that cooperates with the base portion and the restricting portion to form a groove. The restricting portion has a size sufficient for passage through the fastener slot. The connecting portion has a size sufficient for disposal in the fastener slot.

The positioning member is adapted to be extended through the fastener slot when the motherboard is brought in the first direction toward the support such that the base portion is disposed adjacent to the second side of the motherboard, such that the connecting portion is disposed in the fastener slot, and such that the restricting portion is disposed adjacent to the first side of the motherboard.

The positioning member permits movement of the motherboard in a second direction transverse to the first direction from an unlocking position, where a periphery of the fastener slot is disengaged from the groove, and a locking position, where the periphery of the fastener slot is engaged within the groove and where the restricting portion is adapted to engage the periphery of the fastener slot at the first side of the motherboard.

The spring arm is connected to the base portion of the positioning member and extends into the groove so as to be adapted to abut against the second side of the motherboard to urge the motherboard toward the restricting portion when the motherboard is at the locking position.

According to another aspect of the present invention, a computer comprises a computer housing, a support plate, a motherboard, and a set of board-locking fasteners. The support plate is secured to the computer housing. The motherboard has a first side, a second side opposite to the first side in a first direction, and a set of fastener slots extending through the first and second sides of the motherboard. Each of the board-locking fasteners fastens the motherboard on the support plate, and includes a positioning member and a spring arm.

The positioning member has a base portion that is fixed to the support plate, a restricting portion that is spaced apart from the base portion in the first direction, and a connecting portion that extends in the first direction, that interconnects the base portion and the restricting portion, and that cooperates with the base portion and the restricting portion to form a groove. The restricting portion has a size sufficient for passage through a respective one of the fastener slots. The connecting portion has a size sufficient for disposal in the respective one of the fastener slots.

The positioning member extends through the respective one of the fastener slots when the motherboard is brought in the first direction toward the support plate such that the base portion is disposed adjacent to the second side of the motherboard, such that the connecting portion is disposed in the respective one of the fastener slots, and such that the restricting portion is disposed adjacent to the first side of the motherboard.

The positioning member permits movement of the motherboard in a second direction transverse to the first direction from an unlocking position, where a periphery of the respective one of the fastener slots is disengaged from the groove, and a locking position, where the periphery of the respective one of the fastener slots is engaged within the groove and where the restricting portion engages the periphery of the respective one of the fastener slots at the first side of the motherboard.

The spring arm is connected to the base portion of the positioning member and extends into the groove so as to abut against the second side of the motherboard to urge the motherboard toward the restricting portion when the motherboard is at the locking position According to still another aspect of the present invention, a computer comprises a computer housing, a motherboard, and a set of board-locking fasteners. The computer housing has a support plate portion. The motherboard has a first side, a second side opposite to the first side in a first direction, and a set of fastener slots extending through the first and second sides of the motherboard. Each of the board-locking fasteners fastens the motherboard on the support plate portion, and includes a positioning member and a spring arm.

The positioning member has a base portion that is fixed to the support plate portion, a restricting portion that is spaced apart from the base portion in the first direction, and a connecting portion that extends in the first direction, that interconnects the base portion and the restricting portion, and that cooperates with the base portion and the restricting portion to form a groove. The restricting portion has a size sufficient for passage through a respective one of the fastener slots. The connecting portion has a size sufficient for disposal in the respective one of the fastener slots.

The positioning member extends through the respective one of the fastener slots when the motherboard is brought in the first direction toward the support plate such that the base portion is disposed adjacent to the second side of the motherboard, such that the connecting portion is disposed in the respective one of the fastener slots, and such that the restricting portion is disposed adjacent to the first side of the motherboard.

The positioning member permits movement of the motherboard in a second direction transverse to the first direction from an unlocking position, where a periphery of the respective one of the fastener slots is disengaged from the groove, and a locking position, where the periphery of the respective one of the fastener slots is engaged within the groove and where the restricting portion engages the periphery of the respective one of the fastener slots at the first side of the motherboard.

The spring arm is connected to the base portion of the positioning member and extends into the groove so as to abut against the second side of the motherboard to urge the motherboard toward the restricting portion when the motherboard is at the locking position.

BRIEF DESCRIPTION OF THE DRAWINGS

Other features and advantages of the present invention will become apparent in the following detailed description of the preferred embodiments with reference to the accompanying drawings, of which:

FIG. 2 is an exploded perspective view of the first preferred embodiment;

FIG. 3 is an assembled perspective view of the first preferred embodiment;

DETAILED DESCRIPTION OF THE PREFERRED EMBODIMENTS

Figure 1:
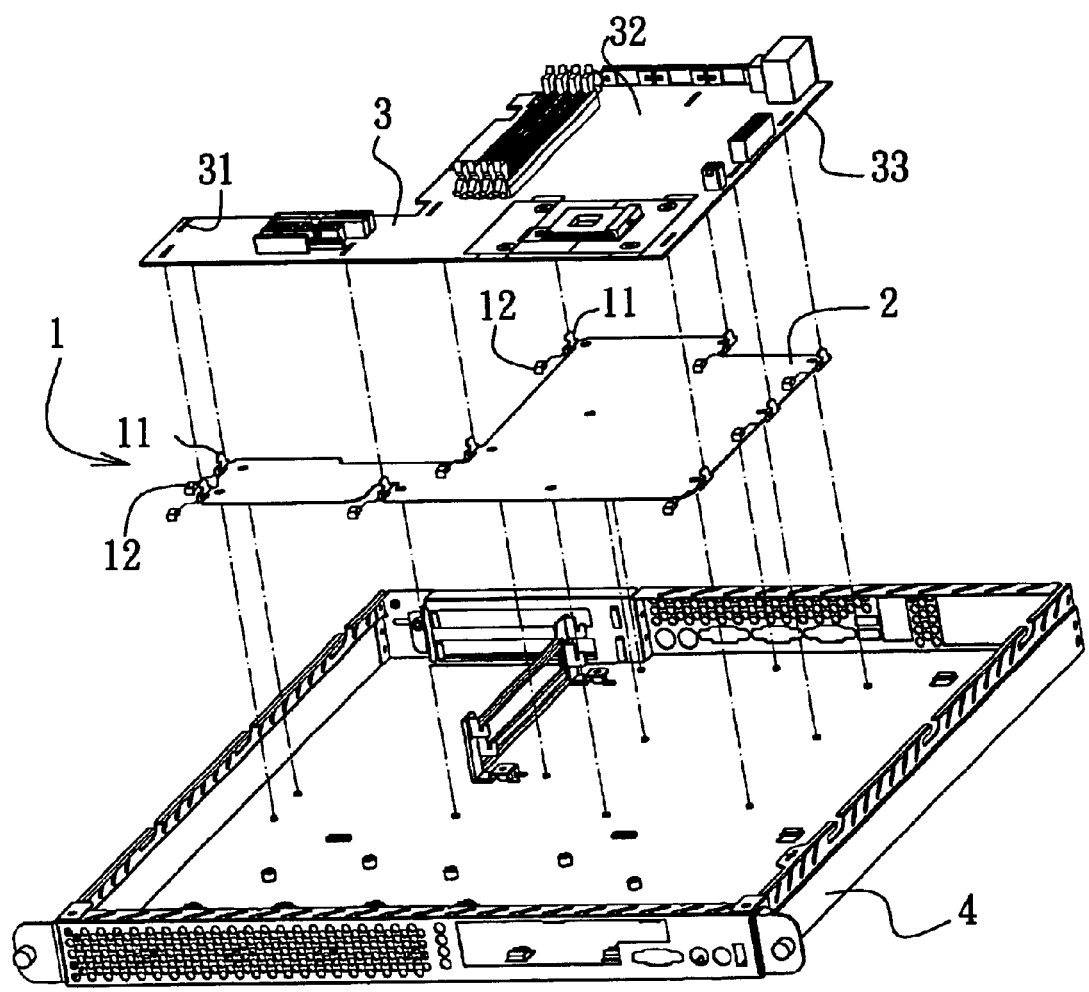
FIG. 1 is an exploded perspective view of a computer including a motherboard, a support plate, a computer housing, and a set of board-locking fasteners of the first preferred embodiment according to the present invention.

Before the present invention is described in greater detail, it should be noted that like elements are denoted by the same reference numerals throughout the disclosure.

Referring to FIGS. 1 to 3, a set of the first preferred embodiment of board-locking fasteners 1 according to the present invention is provided for fastening a motherboard 3 on a support plate 2 that is secured to a computer housing 4 of a computer (not shown). The motherboard 3 has a first side 32, a second side 33 opposite to the first side 32 in a first direction, and a set of fastener slots 31 extending through the first and second sides 32, 33 of the motherboard 3. Each of the board-locking fasteners 1 includes a positioning member 11, a clamping member 12 and a spring arm 123.

The positioning member 11 has a base portion 111 that is adapted to be fixed to the support plate 2, a restricting portion 112 that is spaced apart from the base portion 111 in the first direction, and a connecting portion 115 that extends in the first direction, that interconnects the base portion 111 and the restricting portion 112, and that cooperates with the base portion 111 and the restricting portion 112 to form a groove 113. In this embodiment, the positioning member 11 is formed integrally on the support plate 2. The clamping member 12 includes two clipping plates 122 and a connecting plate 121 that interconnects the clipping plates 122. The clipping plates 122 are configured to clamp the base portion 111 of the positioning member 11 therebetween. Accordingly, the clamping member 12 is connected detachably to the base portion 111 of the positioning member 11. The spring arm 123 extends integrally from the connecting plate 121 of the clamping member 12.

Figure 4:
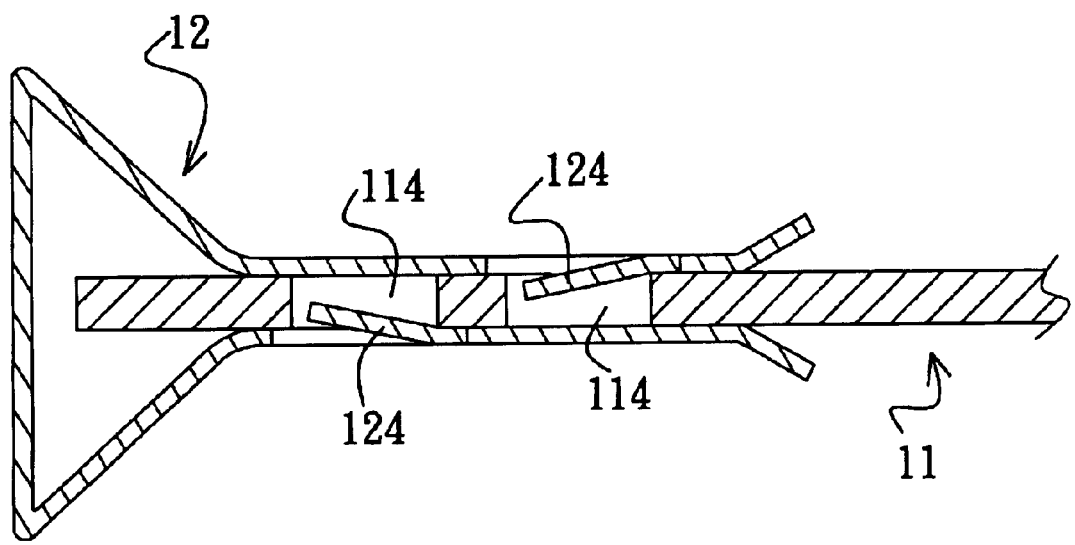
FIG. 4 is a fragmentary sectional view of the first preferred embodiment.

Each of the board-locking fasteners 1 further comprises a hole-and-tab unit. The hole-and-tab unit includes a tab set 124 provided on the clipping plates 122 of the clamping member 12, and a hole set 114 provided in the base portion 111 of the positioning member 11 for retaining removably the clamping member 12 on the positioning member 11, as best shown in FIG. 4.

Figure 5:
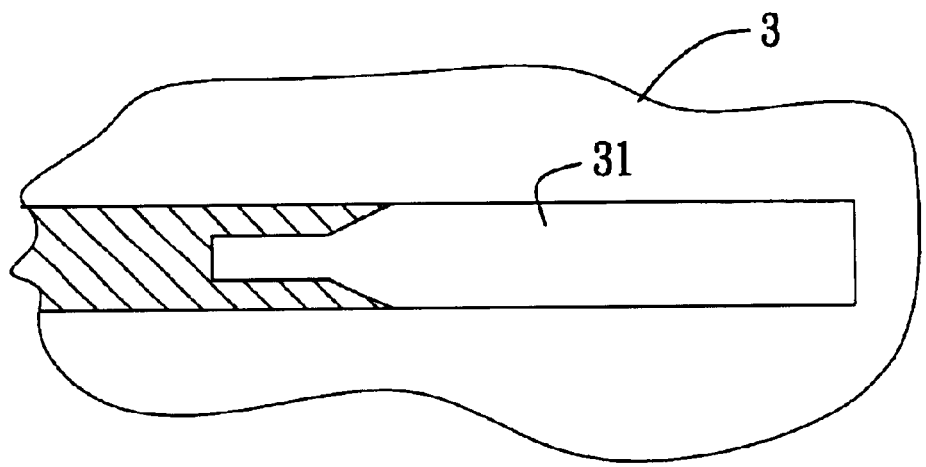
FIG. 5 is a fragmentary sectional view to illustrate a fastener slot in the motherboard.

With further reference to FIG. 5, each of the fastener slots 31 in the motherboard 3 has a first section with a first width, and a second section with a second width. Preferably, the width of the fastener slot is gradually reduced from the first section to the second section. The restricting portion 112 of the positioning member 11 (see FIGS. 6 to 8) has a size sufficient for passage through the first section of the respective fastener slot 31. The connecting portion 115 of the positioning member 11 (see FIGS. 6 to 8) has a size sufficient for disposal in the second section of the respective fastener slot 31. Each of the fastener slots 31 is generally rectangular in shape.

Figure 6:
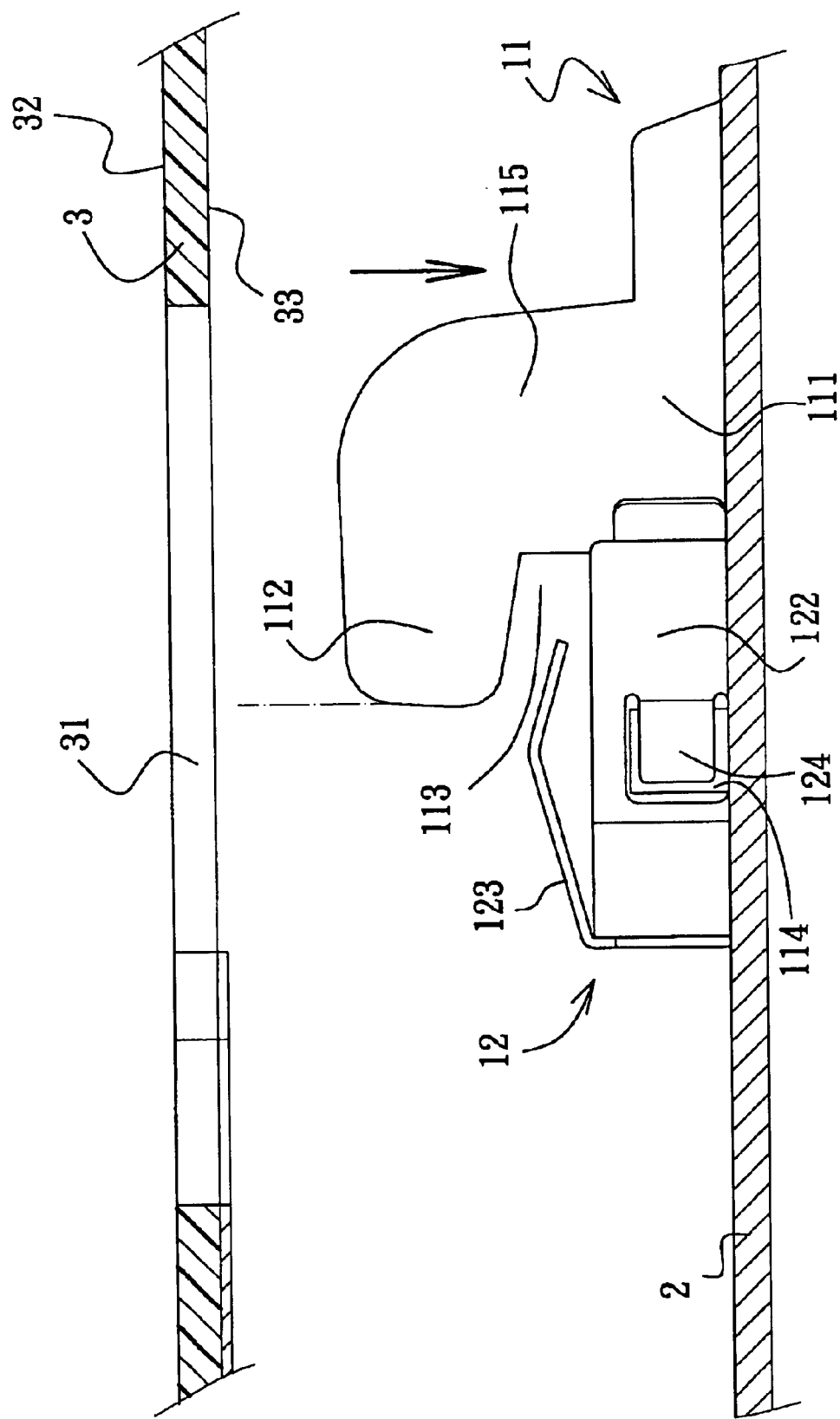
FIGS. 6 to 8 illustrate consecutive steps for fastening the motherboard on the support plate in accordance with the first preferred embodiment.
Figure 7:
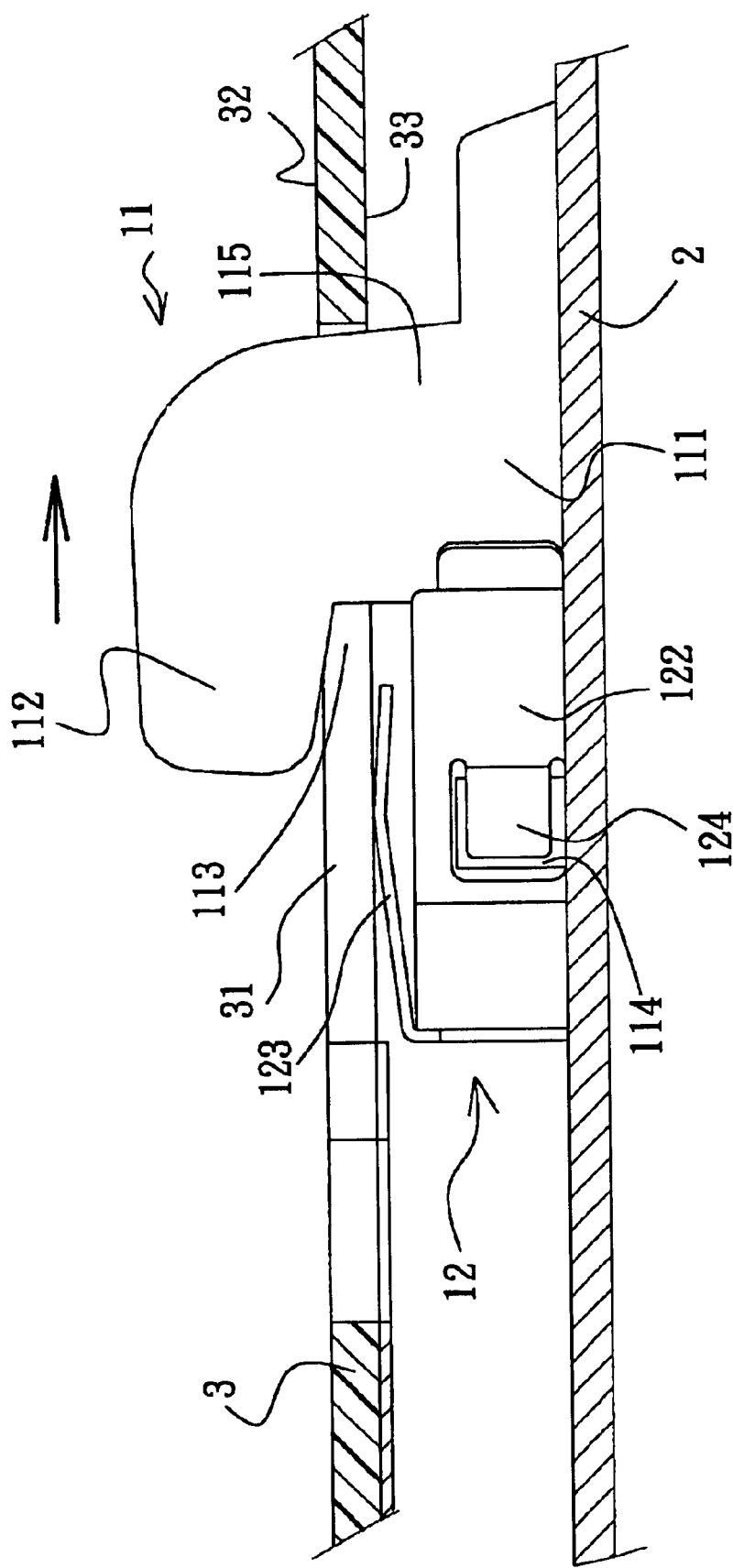
Figure 8:
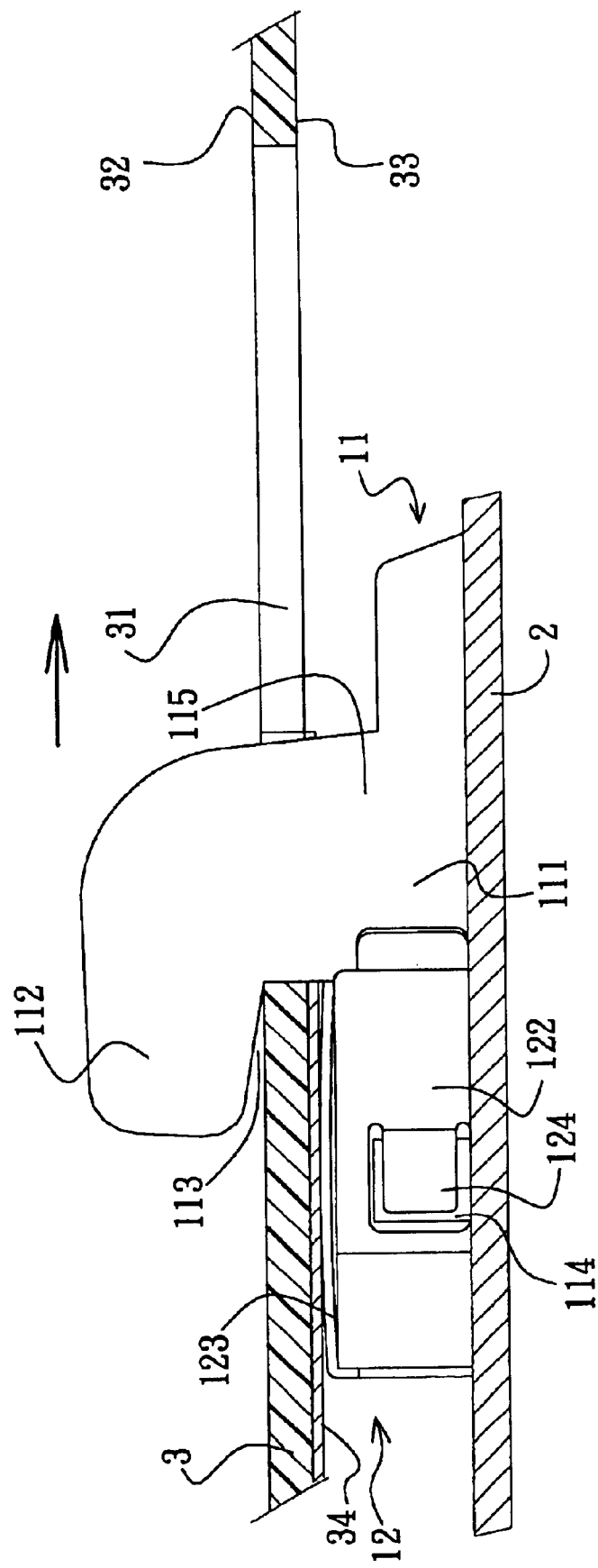

As illustrated in FIGS. 6 to 8, the clamping member 12 is connected to the base portion 111 of the positioning member 11 such that the clipping plates 122 are disposed on opposite sides of the base portion 111, such that the tab set 124 on the clipping plates 122 engages the hole set 114 in the base portion 111, and such that the spring arm 123 extends into the groove 113. The positioning member 11 is extended through the first section of the fastener slot 31 when the motherboard 3 is brought in the first direction toward the support plate 2 such that the base portion 111 is disposed adjacent to the second side 33 of the motherboard 3, such that the connecting portion 115 is disposed in the fastener slot 31, and such that the restricting portion 112 is disposed adjacent to the first side 32 of the motherboard 3.

The positioning member 11 permits movement of the motherboard 3 in a second direction transverse to the first direction from an unlocking position, where the periphery of the second section of the fastener slot 31 is disengaged from the groove 113, and a locking position, where the periphery of the second section of the fastener slot 31 is engaged within the groove 113, where the restricting portion 112 engages the periphery of the second section of the fastener slot 31 at the first side 32 of the motherboard 3, and where the spring arm 123 abuts against the second side 33 of the motherboard 3 to urge the motherboard 3 toward the restricting portion 112. Therefore, in view of the presence of the board-locking fasteners 1, the motherboard 3 can be easily and rapidly fastened to or removed from support plate 2 on the computer housing 4.

Figure 9:
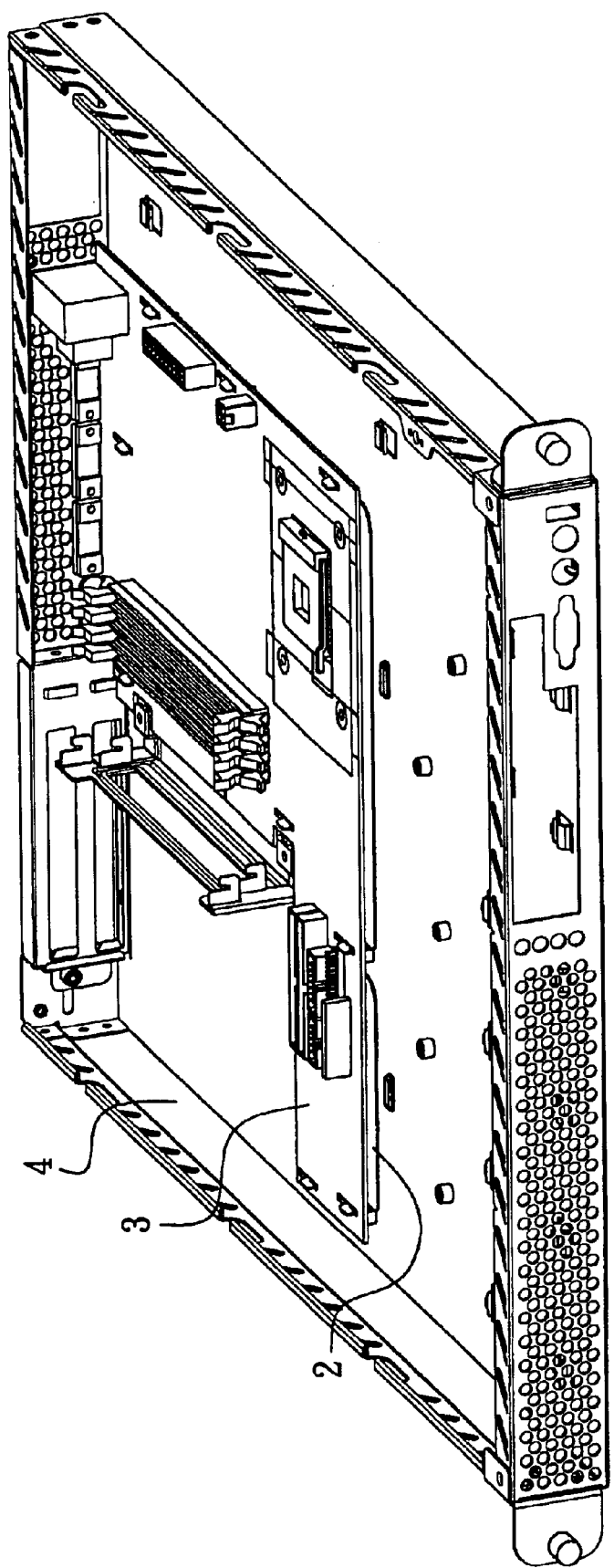
FIG. 9 is a perspective view of the computer of FIG. 1 in an assembled state.

FIG. 9 illustrates the motherboard 3 when fastened to the support plate 2 of the computer housing 4 using the fasteners 1.

Referring back to FIG. 8, the second side 33 of the motherboard 3 is provided with a grounding circuit 34 at positions adjacent to the second sections of the fastener slots 31. In this embodiment, each of the computer housing 4, the support plate 2, and the positioning member 11, the spring arm 123 and the clamping member 12 of each of the fasteners 1 is made of an electrically conductive material. Accordingly, the spring arm 123 is adapted to establish electrical connection with the grounding circuit 34 on the second side 33 of the motherboard 3 to establish a grounding path to the computer housing 4 for the grounding circuit 34 of the motherboard 3.

Figure 10:
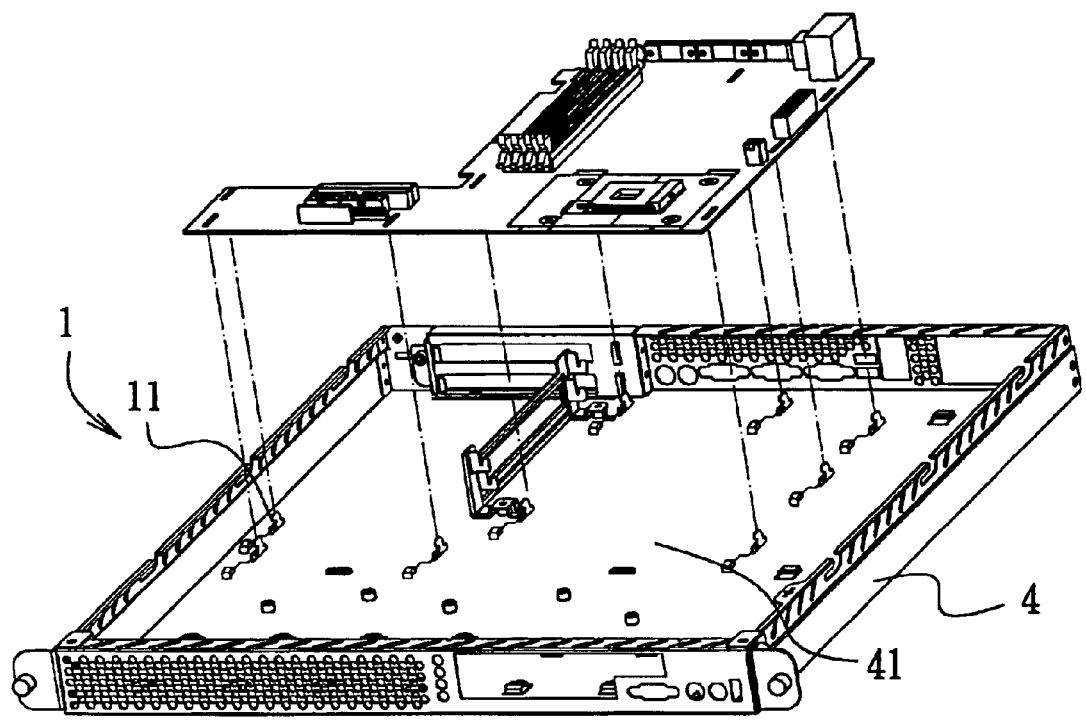
FIG. 10 is an exploded perspective view of a computer including motherboard, a computer housing having a support plate portion, and a set of board-locking fasteners of the second preferred embodiment according to the present invention.

FIG. 10 illustrates the second preferred embodiment of a board-locking fastener according to the present invention. When compared with the previous embodiment, the computer housing 4 has a support plate portion 41. In this embodiment, the positioning member 11 of each of the fasteners 1 is formed integrally on the support plate portion 41.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A board-locking fastener adapted to fasten a motherboard on a support, the motherboard having a first side, a second side opposite to the first side in a first direction, and a fastener slot that extends through the first and second sides of the motherboard, said board-locking fastener comprising:

a positioning member having a base portion that is adapted to be fixed to the support, a restricting portion that is spaced apart from said base portion in the first direction, and a connecting portion that extends in the first direction, that interconnects said base portion and said restricting portion, and that cooperates with said base portion and said restricting portion to form a groove, said restricting portion having a size sufficient for passage through the fastener slot, said connecting portion having a size sufficient for disposal in the fastener slot, said positioning member being adapted to be extended through the fastener slot when the motherboard is brought in the first direction toward the support such that said base portion is disposed adjacent to the second side of the motherboard, such that said connecting portion is disposed in the fastener slot, and such that said restricting portion is disposed adjacent to the first side of the motherboard, said positioning member permitting movement of the motherboard in a second direction transverse to the first direction from an unlocking position, where a periphery of the fastener slot is disengaged from said groove, and a locking position, where the periphery of the fastener slot is engaged within said groove and where said restricting portion is adapted to engage the periphery of the fastener slot at the first side of the motherboard; and a spring arm connected to said base portion of said positioning member and extending into said groove so as to be adapted to abut against the second side of the motherboard to urge the motherboard toward said restricting portion when the motherboard is at the locking position.

2. The board-locking fastener of claim 1, further comprising a clamping member connected detachably to said base portion of said positioning member, said spring arm extending integrally from said clamping member.

3. The board-locking fastener of claim 2, wherein said clamping member includes two clipping plates and a connecting plate that interconnects said clipping plates, said clipping plates being disposed on opposite sides of said base portion and being configured to clamp said base portion of said positioning member therebetween.

4. The board-locking fastener of claim 3, wherein said spring arm extends from said connecting plate.

5. The board-locking fastener of claim 3, further comprising a hole-and-tab unit provided on said clipping plates of said clamping member and said base portion of said positioning member for retaining removably said clamping member on said positioning member.

6. The board-locking fastener of claim 2, wherein said spring arm, said clamping member and said positioning member are made of an electrically conductive material, said spring arm being adapted to establish electrical connection with a grounding circuit on the second side of the motherboard.

7. A computer comprising:

a computer housing;

a support plate secured to said computer housing;

a motherboard having a first side, a second side opposite to said first side in a first direction, and a set of fastener slots extending through said first and second sides of said motherboard; and a set of board-locking fasteners for fastening said motherboard on said support plate, each of said fasteners including a positioning member having a base portion that is fixed to said support plate, a restricting portion that is spaced apart from said base portion in the first direction, and a connecting portion that extends in the first direction, that interconnects said base portion and said restricting portion, and that cooperates with said base portion and said restricting portion to form a groove, said restricting portion having a size sufficient for passage through a respective one of said fastener slots, said connecting portion having a size sufficient for disposal in the respective one of said fastener slots, said positioning member extending through the respective one of said fastener slots when said motherboard is brought in the first direction toward said support plate such that said base portion is disposed adjacent to said second side of said motherboard, such that said connecting portion is disposed in the respective one of said fastener slots, and such that said restricting portion is disposed adjacent to said first side of said motherboard, said positioning member permitting movement of said motherboard in a second direction transverse to the first direction from an unlocking position, where a periphery of the respective one of said fastener slots is disengaged from said groove, and a locking position, where said periphery of the respective one of said fastener slots is engaged within said groove and where said restricting portion engages said periphery of the respective one of said fastener slots at said first side of said motherboard, and a spring arm connected to said base portion of said positioning member and extending into said groove so as to abut against said second side of said motherboard to urge said motherboard toward said restricting portion when said motherboard is at the locking position.

8. The computer of claim 7, wherein each of said fasteners further includes a clamping member connected detachably to said base portion of said positioning member, said spring arm extending integrally from said clamping member.

9. The computer of claim 8, wherein said clamping member includes two clipping plates and a connecting plate that interconnects said clipping plates, said clipping plates being disposed on opposite sides of said base portion and being configured to clamp said base portion of said positioning member therebetween.

10. The computer of claim 9, wherein said spring arm extends from said connecting plate.

11. The computer of claim 9, wherein each of said fasteners further includes a hole-and-tab unit provided on said clipping plates of said clamping member and said base portion of said positioning member for retaining removably said clamping member on said positioning member.

12. The computer of claim 8, wherein said second side of said motherboard is provided with a grounding circuit, and each of said computer housing, said support plate, and said positioning member, said spring arm and said clamping member of each of said fasteners is made of an electrically conductive material to establish a grounding path to said computer housing for said grounding circuit on said second side of said motherboard.

13. The computer of claim 7, wherein said positioning member of each of said fasteners is formed integrally on said support plate.

14. A computer comprising:

a computer housing having a support plate portion;

a motherboard having a first side, a second side opposite to said first side in a first direction, and a set of fastener slots extending through said first and second sides of said motherboard; and a set of board-locking fasteners for fastening said motherboard on said support plate portion, each of said fasteners including a positioning member having a base portion that is fixed to said support plate portion, a restricting portion that is spaced apart from said base portion in the first direction, and a connecting portion that extends in the first direction, that interconnects said base portion and said restricting portion, and that cooperates with said base portion and said restricting portion to form a groove, said restricting portion having a size sufficient for passage through a respective one of said fastener slots, said connecting portion having a size sufficient for disposal in the respective one of said fastener slots, said positioning member extending through the respective one of said fastener slots when said motherboard is brought in the first direction toward said support plate such that said base portion is disposed adjacent to said second side of said motherboard, such that said connecting portion is disposed in the respective one of said fastener slots, and such that said restricting portion is disposed adjacent to said first side of said motherboard, said positioning member permitting movement of said motherboard in a second direction transverse to the first direction from an unlocking position, where a periphery of the respective one of said fastener slots is disengaged from said groove, and a locking position, where said periphery of the respective one of said fastener slots is engaged within said groove and where said restricting portion engages said periphery of the respective one of said fastener slots at said first side of said motherboard, and a spring arm connected to said base portion of said positioning member and extending into said groove so as to abut against said second side of said motherboard to urge said motherboard toward said restricting portion when said motherboard is at the locking position.

15. The computer of claim 14, wherein each of said fasteners further includes a clamping member connected detachably to said base portion of said positioning member, said spring arm extending integrally from said clamping member.

16. The computer of claim 15, wherein said clamping member includes two clipping plates and a connecting plate that interconnects said clipping plates, said clipping plates being disposed on opposite sides of said base portion and being configured to clamp said base portion of said positioning member therebetween.

17. The computer of claim 16, wherein said spring arm extends from said connecting plate.

18. The computer of claim 16, wherein each of said fasteners further includes a hole-and-tab unit provided on said clipping plates of said clamping member and said base portion of said positioning member for retaining removably said clamping member on said positioning member.

19. The computer of claim 15, wherein said second side of said motherboard is provided with a grounding circuit, and each of said computer housing and said positioning member, said spring arm and said clamping member of each of said fasteners is made of an electrically conductive material to establish a grounding path to said computer housing for said grounding circuit on said second side of said motherboard.

20. The computer of claim 14, wherein said positioning member of each of said fasteners is formed integrally on said support plate portion.

* * * * *